(12) United States Patent
Cutrona

(10) Patent No.: US 7,573,237 B2
(45) Date of Patent: Aug. 11, 2009

(54) SYSTEM AND METHOD FOR MONITORING BATTERY STATE

(75) Inventor: Anthony J. Cutrona, Vaughan (CA)

(73) Assignee: PowerCart Systems, Inc., Mississauga, Ontario (CA)

( * ) Notice: Subject to any disclaimer, the term of this patent is extended or adjusted under 35 U.S.C. 154(b) by 333 days.

(21) Appl. No.: 11/359,760

(22) Filed: Feb. 23, 2006

(65) Prior Publication Data

US 2007/0194756 A1    Aug. 23, 2007

(51) Int. Cl.
*H02J 7/00* (2006.01)
*H01M 10/34* (2006.01)

(52) U.S. Cl. .................. 320/132; 320/114; 320/116; 429/60

(58) Field of Classification Search .......... 320/132, 320/114; 429/60
See application file for complete search history.

(56) References Cited

U.S. PATENT DOCUMENTS 6,366,054 B1 *   4/2002   Hoenig et al. ............... 320/132
2002/0030494 A1 *   3/2002   Araki et al. .................. 324/427

FOREIGN PATENT DOCUMENTS

EP            0560468         9/1993

\* cited by examiner

*Primary Examiner*—Adolf Berhane
*Assistant Examiner*—Yalkew Fantu
(74) *Attorney, Agent, or Firm*—Shoemaker and Mattare

(57) ABSTRACT

A method of monitoring a battery includes measuring an open circuit voltage ($V_{oc}$) on the battery to determine a measured state of charge ($SOC_m$) after at least one use, obtaining a calculated state of charge ($SOC_c$) based on a state of charge prior to the at least one use and a discharge of the battery during the at least one use, and determining a state of the battery based at least in part on a difference between the calculated state of charge and the measured state of charge.

23 Claims, 3 Drawing Sheets

| Cycle | Step | Voltage [V] | SOCm [%] | Discharge Ah | SOC* [%] | Rate | GON [%] | SOCc [%] | E1 | Error E2 | E3 |
|---|---|---|---|---|---|---|---|---|---|---|---|
| 0 | 0 | 12.50 | 80.0 | | | | 100.00 | | 0.0 | 0.0 | 0.0 |
| | | | | | | 1.00 | 100.00 | 80 | | | |
| 1 | 1 | | | -5 | | | | | | | |
| 1 | 2 | | | | 75.0 | | | | | | |
| 1 | 3 | | | | 75.0 | 1.00 | | 75.0 | | | |
| 1 | 4 | 12.33 | 73.2 | | | | | | | | |
| 1 | 5 | | 73.2 | | | | | 75.0 | 1.8 | 0.0 | 0.0 |
| 1 | 6 | | | | | 0.98 | | | | | |
| 1 | 7 | | | | | 0.98 | 98.20 | | | | |
| 2 | 1 | | | -5 | | | | | | | |
| 2 | 2 | | | | 70.0 | | | | | | |
| 2 | 3 | | | | 70.0 | 0.98 | | 68.7 | | | |
| 2 | 4 | 12.20 | 68.0 | | | | | | | | |
| 2 | 5 | | 68.0 | | | | | 68.7 | 0.7 | 1.8 | 0.0 |
| 2 | 6 | | | | | 0.96 | | | | | |
| 2 | 7 | | | | | 0.96 | 95.66 | | | | |
| 3 | 1 | | | -5 | | | | | | | |
| 3 | 2 | | | | 63.7 | | | | | | |
| 3 | 3 | | | | 63.7 | 0.96 | | 61.0 | | | |
| 3 | 4 | 12.02 | 60.8 | | | | | | | | |
| 3 | 5 | | 60.8 | | | | | 61.0 | 0.2 | 0.7 | 1.8 |
| 3 | 6 | | | | | 0.93 | | | | | |
| 3 | 7 | | | | | 0.93 | 92.95 | | | | |
| 4 | 1 | | | -5 | | | | | | | |
| 4 | 2 | | | | 56.0 | | | | | | |
| 4 | 3 | | | | 56.0 | 0.93 | | 52.0 | | | |
| 4 | 4 | 11.82 | 52.8 | | | | | | | | |
| 4 | 5 | | 52.8 | | | | | 52.0 | -0.8 | 0.2 | 0.7 |
| 4 | 6 | | | | | 0.93 | | | | | |
| 4 | 7 | | | | | 0.93 | 92.81 | | | | |
| 5 | 1 | | | -5 | | | | | | | |
| 5 | 2 | | | | 47.0 | | | | | | |
| 5 | 3 | | | | 47.0 | 0.93 | | 43.6 | | | |
| 5 | 4 | 11.57 | 42.8 | | | | | | | | |
| 5 | 5 | | 42.8 | | | | | 43.6 | 0.8 | -0.8 | 0.2 |
| 5 | 6 | | | | | 0.93 | | | | | |
| 5 | 7 | | | | | 0.93 | 92.56 | | | | |
| 6 | 1 | | | -5 | | | | | | | |
| 6 | 2 | | | | 38.6 | | | | | | |
| 6 | 3 | | | | 38.6 | 0.93 | | 35.8 | | | |
| 6 | 4 | 11.40 | 36.0 | | | | | | | | |
| 6 | 5 | | 36.0 | | | | | 35.8 | -0.2 | 0.8 | -0.8 |
| 6 | 6 | | | | | 0.93 | | | | | |
| 6 | 7 | | | | | 0.93 | 92.73 | | | | |

FIG.2

SYSTEM AND METHOD FOR MONITORING BATTERY STATE

FIELD OF THE INVENTION

The present invention relates to battery monitoring for determining battery state to obtain a better estimation of battery lifetime.

BACKGROUND OF THE INVENTION

Batteries are generally well understood devices that convert stored chemical energy into electrical energy. With changes in electronics and power requirements such as changes from analog to digital loads, battery technology is ever evolving and improving technically in chemistry, process control, material and control electronics. With the proliferation of digital electronics and wireless communications, batteries are becoming increasingly vital in modern technology. In many cases, the battery is the limiting factor for the size, shape and run time (or life) of the device which it serves.

Batteries have a limited lifetime, which is nonlinearly related to the chemical composition, application, environmental factors, and use/maintenance. Because batteries are a consumable, it is understood that battery performance declines over the lifetime until the battery eventually stops working. A problem lies in identifying when the battery will stop working, in advance of such a failure. This is vital, especially in critical applications that are dependant on battery power. For example, factories or even hospitals that require battery power cannot afford battery failure in certain applications.

Voltage measurement is commonly used to determine the state of a battery. When the measured voltage is below a predetermined threshold value, the battery is considered to be at or near the end of the battery lifetime and is replaced. While this is a simple measurement technique, it suffers from many disadvantages. For example, the battery must be charged prior to testing. If the battery is not fully charged, an incorrect determination that the battery requires changing is made. Further, this measurement does not estimate lifetime of the battery and does not consider load conditions during use or the pattern of use of the battery.

In another prior art battery testing method, a known load is applied to a battery while the voltage discharge is measured and used as an indication of battery state. This method requires that the battery be taken out of service for testing and charged prior to testing. Further, this test does not accurately reflect the load conditions during use and pattern of use of the battery, thereby resulting in inaccurate or unreliable results.

Other prior art systems use Electrochemical Impedance Spectroscopy (EIS) in conjunction with trending software to monitor the battery chemistry. Regular maintenance of battery systems (ie telecomm UPS systems) includes the use of an EIS device to quantify the state of the battery. These prior art systems for estimating the state of batteries suffer many disadvantages. For example, many systems estimate battery lifetime without consideration of the application, the load conditions during use or the pattern of use. Thus, the estimated lifetime is inaccurate or unreliable.

A better system and technique for estimating the state of a battery and an estimated lifetime is therefore desirable.

SUMMARY OF THE INVENTION

In accordance with one aspect of the present invention, there is provided a method of monitoring a battery that includes measuring an open circuit voltage ($V_{oc}$) on the battery to determine a measured state of charge ($SOC_m$) after at least one use, obtaining a calculated state of charge ($SOC_c$) based on a state of charge prior to the at least one use and a discharge of the battery during the at least one use, and determining a state of the battery based at least in part on a difference between the calculated state of charge and the measured state of charge.

In accordance with another aspect of the present invention, there is provided a system for determining state of health of a battery. The system includes a meter for measuring an open circuit voltage on the battery to determine a measured state of charge after at least one use and a calculation device for determining a calculated state of charge based on a state of charge prior to the at least one use and a calculated discharge of the battery during the at least one use, and for determining a state the battery based at least in part on the difference between the calculated state of charge and the measured state of charge.

In accordance with another aspect of the present invention, there is provided a method of monitoring a battery. The method includes measuring an electrical characteristic after at least one use to provide a measured electrical characteristic, obtaining a calculated electrical characteristic based on the electrical characteristic prior to the at least one use and a discharge of the battery during the at least one use, and determining a state of the battery based at least in part on a difference between the measured electrical characteristic and the calculated electrical characteristic.

According to an aspect of the present invention, there is provided a method of monitoring state of health using battery parameters obtained while in use to develop a battery model. Therefore, the battery is not taken off-line for measurement or calculations. Instead, the state of health determination is related to the particular application and pattern of use of the battery.

Although an accurate indication of battery condition or State of Health (SOH) cannot be directly measured, the internal impedance of a battery reflects the internal electrochemical condition of the battery. A direct relation does not exist between internal impedance and SOH. However, in one aspect of the present invention, the evolution of internal impedance over the lifetime of the battery is used as an indication of the SOH.

Advantageously, an embedded controller measures state of health and provides an estimation of battery lifetime. In a particular aspect of the present invention, a warning is provided for the user to replace the battery in advance of failure. The embedded controller provides greatly increased reliability of the system as a more accurate indication of battery lifetime is provided.

BRIEF DESCRIPTION OF THE DRAWINGS

An embodiment of the present invention will now be described, by way of example only, with reference to the attached Figure, wherein:

FIG. 2 is a table illustrating an exemplary series of measurements and calculations for monitoring the state of health of a battery, according to the embodiment of FIG. 1.

DETAILED DESCRIPTION OF THE INVENTION

Figure 1:
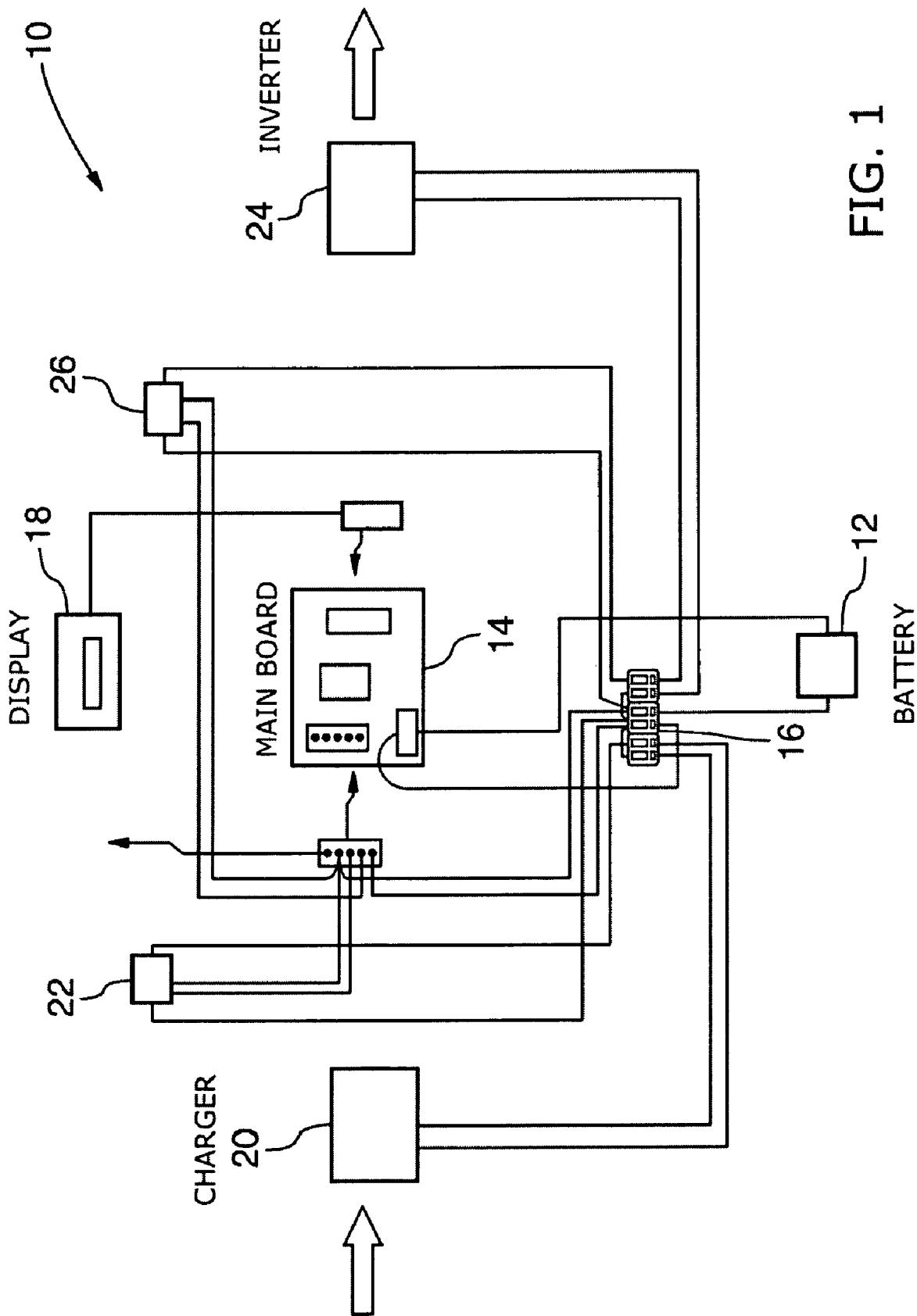
FIG. 1 is a schematic representation of a system for monitoring battery state of health according to one embodiment of the present invention.

Reference is first made to FIG. 1 to describe a system and method of determining state of a battery, the system indicated generally by the numeral 10. An open circuit voltage ($V_{oc}$) of the battery 12 is measured to determine a measured state of charge ($SOC_m$). A calculated state of charge ($SOC_c$) is determined based on a state of charge prior to at least one use and a calculated discharge of the battery during the at least one use. The state of the battery is determined based at least in part on the difference between the calculated state of charge and the measured state of charge. Thus, a measured electrical characteristic ($SOC_m$) is compared to a calculated electrical characteristic ($SOC_c$) to determine a state of health of the battery.

The system 10 according to one embodiment includes a main board 14 with a controller and a current sensor for measuring current, as well as a voltage divider from which open circuit voltage $V_{oc}$ of the battery is measured in order to determine the measured state of charge ($SOC_m$). The controller calculates the calculated state of charge ($SOC_c$) based on the state of charge prior to the at least one use and the calculated discharge of the battery during the at least one use. The controller also determines the state of health of the battery based at least in part on the difference between the calculated state of charge and the measured state of charge.

Setup and connection of the system 10 is well within the grasp of one skilled in the art. The main board 14 including the controller, the current sensor for measuring current and the voltage divider is connected to the lead acid battery 12 through the connectors 16. An LCD display 18 is connected directly to the main board 14 for displaying, for example, the last determined state of health of the battery 12 or a voltage measurement. A charger 20 is operably connected through the connectors 16 and a charge control relay 22 to the main board 14 and the battery 12, for charging the battery 12. An output inverter 24 is operably connected through the connectors 16 and a discharge control relay 26 to the main board 14 and the battery 12, for using and thereby discharging the battery 12. It will be appreciated that the system 10 is portable along with the battery 12.

The following portion of the disclosure is intended to provide definitions for terms used herein in order to aid in understanding the embodiment disclosed herein.

The State of Charge (SOC) is the percentage of electrochemical potential remaining in a battery. Because batteries are not ideal, a calculated state of charge, that is, the State of Charge approximated during use, is not always equivalent to the ideal measured state of charge.

The Measured State of Charge ($SOC_m$) is the SOC obtained via measurement of the open circuit voltage ($V_{oc}$)—voltage without load—of the battery.

The Depth of Discharge (DOD) is the percentage of capacity removed from battery. DOD is calculated during use of the battery via coulomb counting.

The Calculated State of Charge ($SOC_c$) is the SOC obtained by using the DOD of the battery during use. Ideally, SOC=1−DOD.

The State of Health (SOH) is the percentage of capacity a battery is able to provide, with respect to its rated value.

Ideally, $SOC_m$=1−DOD and $SOC_m$=$SOC_c$. Unfortunately, however, battery performance declines over the lifetime of the battery and therefore, $SOC_m$≠1−DOD. Similarly, $SOC_m$≠$SOC_c$. This discrepancy is accounted for by the SOH which is adjusted according to the errors produced between the determined DOD and the $SOC_m$. In particular, a scaling factor β is used to relate $SOC_m$ and $SOC_c$. To summarize, the SOH decreases over the lifetime of the battery and therefore the calculated or expected State of Charge $SOC_c$ is not equal to the measured State of Charge.

To determine the SOH of the battery, $SOC_m$ is obtained after a discharge period, while $SOC_c$ is cumulatively calculated during that period via coulomb counting, and taking into account an expected state of charge prior to the discharge period. For example, $SOC_c$ of the battery can be determined after at least one discharge of the battery and prior to charging. In order to calculate $SOC_c$, $SOC_n'$ is first calculated as follows:

$$SOC_n' = SOCc_{n-1} + \frac{IdT}{C'},$$

where $$SOC_n'$$

is the ideal state of charge (calculated using coulomb counting as indicated). It will be appreciated that n refers to a cycle number. Thus, $$SOC'$$

is calculated taking into account $SOC_c$ for the previous cycle and by coulomb counting. C' is the capacity and is related to the discharge rate of the battery during use. The value of C' is determined as follows:

$$C' = C_o \left(\frac{I}{I_o}\right)^{-\gamma},$$

where $C_o$ is the rated capacity (amp hours), I is the actual current discharged (amps), and $I_o$ is the rated current (amps). The value of γ is based on battery discharge curves using battery run time data. The ideal state of charge $$SOC_n'$$

is then used to determine $SOC_c$, taking the SOH into account as follows:

$$SOCc_n = \beta \times SOC_n',$$

where β is a fraction that represents the SOH of the battery.

As shown, each new $SOC_c$ is calculated taking into account the previously calculated $SOC_c$ and the value of β. In the first $SOC_c$, β=1 (given that the battery is new). The $SOC_m$ is measured by measurement of the $V_{oc}$ when the battery is not discharging and after a rest period for the $V_{oc}$ to settle. An error value is produced based on the difference between $SOC_c$ and $SOC_m$:

$$\xi = SOC_c - SOC_m,$$

where $\xi$ denotes the error.

The error is used to adjust $\beta$, thereby diminishing errors calculated in subsequent cycles and therefore producing an accurate $SOC_c$. A positive error indicates that there is less available energy than calculated and $\beta$ is therefore decreased. Conversely, a negative error indicates that there is more energy than indicated by the $SOC_c$ and $\beta$ is therefore increased. The adjustments are proportional to the errors, and implemented with a weighted moving average kernel.

The change in $\beta$ is calculated by calculating a weighted average of the errors calculated as follows:

$$\Delta\beta_n = \lambda\left(\frac{n-1}{n}\sum_{x}^{n-1}\xi_x + \frac{2}{n}\xi_n\right),$$

where $\lambda$ is a scaling factor. The value of $\beta$ is then calculated based on the previously calculated value of $\beta$ and the change in $\beta$, as follows:

$$\beta_{n+1} = \beta_n - \Delta\beta_n.$$

The resulting calculated $\beta$ is a value between 0 and 1. The SOH is $100\times\beta$.

It will be appreciated that the determined SOH provides an indication of battery life taking into account the load conditions and pattern of use of the battery. Using this number for SOH, limitations can be set for replacement of a battery in a particular application. For example, for a particular application, a battery may be replaced at a SOH value of 70(%).

The following example is intended to further illustrate an embodiment of the present invention. Referring to FIG. 2, there is shown a table illustrating an exemplary series of measurements in monitoring the state of health of a battery. For the purpose of the present example the battery 12 is a 100 Ah battery.

Figure 3:
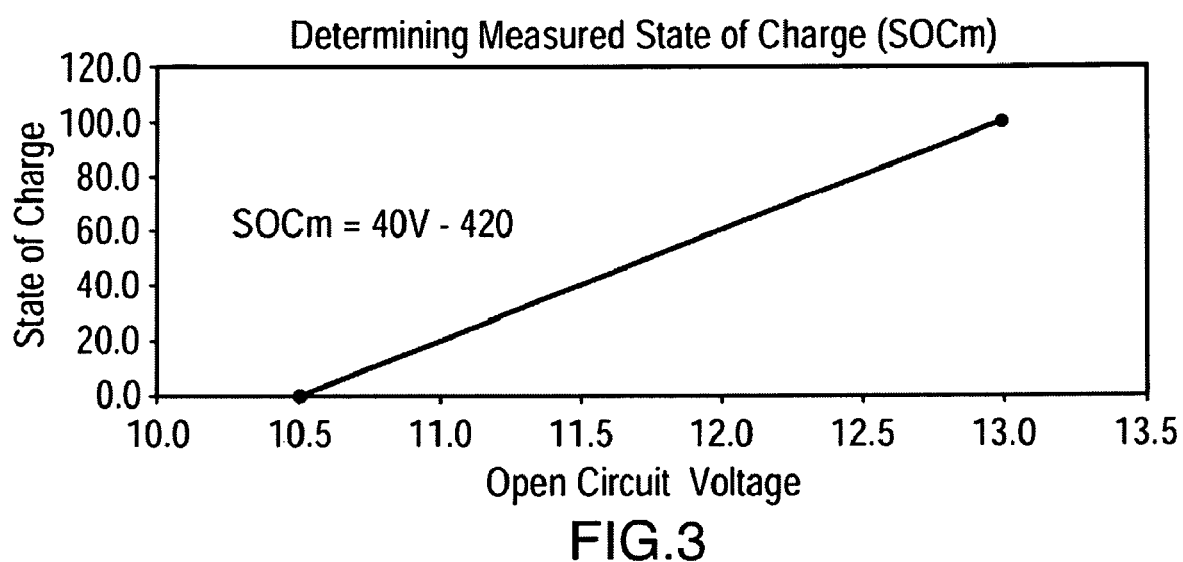
FIG. 3 is a graph for determining a measured state of charge in the exemplary series of FIG. 2.

The 100 Ah battery 12 is connected to the system for determining the state of health of the battery shown in FIG. 1. Because the battery is new, the SOH is assumed to be 100%. The open circuit voltage measured on the 100 Ah battery 12.5V. Using the graph for determining the measured state of charge shown in FIG. 3, the $SOC_m$ is 80% (see Cycle 0, Step 0 in FIG. 2). The graph of FIG. 3 shows the $SOC_m$ as a function of $V_{oc}$. In general, a lead acid battery is considered to be at 100% State of Charge at approximately 13V and at 0% State of Charge at approximately 10.5V as shown in FIG. 3.

During a first cycle of use of the battery, it is determined that 5 Ah is removed from the battery (discharged) using coulomb counting. It will be appreciated that with a 100 Ah battery, a discharge of 5 Ah from the battery should result in a 5% decrease in the state of charge $$\left(\frac{5\text{ Ah}}{100\text{ Ah}}*100\%.\right)$$

Thus, the ideal $$\text{State of Charge}(SOC') \text{ is } 80\% - 5\% = 75\%.$$

The calculated State of Charge $SOC_c$ is determined by multiplying $$SOC'$$

by $\beta$. In this cycle, $\beta$ is 1.00 and thus, $$SOC' = SOC_c.$$

The open circuit voltage ($V_{oc}$) is then measured to determine the $SOC_m$ and the error is obtained from the difference between $SOC_c$ and $SOC_m$. As indicated above, the $V_{oc}$ is measured when the battery is not discharging (or charging) and after a rest period for the $V_{oc}$ to settle. In Cycle 1 of the present example, the $V_{oc}$ is measured at 12.33V and the $SOC_m$ is determined to be 73.2%. Thus, the error is determined to be 1.8 using the formula $$\xi = SOC_c - SOC_m.$$

The error registers, E1, E2 and E3 are updated by shifting the error values so that the current error is entered into E1, and the previous error from E1 is moved to E2 while the previous error from E2 is moved to E3. The new $\beta$ value is then calculated based on the error values and the previous value of $\beta$, using the formulas:

$$\Delta\beta_n = \lambda\left(\frac{n-1}{n}\sum_{x}^{n-1}\xi_x + \frac{2}{n}\xi_n\right)$$

and $$\beta_{n+1} = \beta_n - \Delta\beta_n,$$

as indicated above. Thus $\beta$ is determined to be 0.98. The SOH is $100\%\times\beta$ and is calculated to be 98.2%.

During a second cycle of use, it is determined that 5 Ah is again removed from the battery. As shown above, 5 Ah removed from the battery should result in a 5% decrease in the state of charge. Thus, $$SOC' \text{ is } 75\% - 5\% = 70\%.$$

$SOC_c$ is then determined by multiplying $$SOC'$$

by $\beta$. In this cycle, $\beta$ is 0.98 and thus, $SOC_c=68.7$. $V_{oc}$ is then measured to determine $SOC_m$ and the error is obtained from the difference between $SOC_c$ and $SOC_m$. In Cycle 2 of the present example, $V_{oc}$ is measured at 12.20V and the $SOC_m$ is determined to be 68%. Thus, the error is determined to be 0.7. The error registers, E1, E2 and E3 are updated by shifting the error values so that the current error is entered into E1. The new $\beta$ value is then calculated based on the error values and the previous value of $\beta$.

During a third cycle of use, it is determined that 5 Ah is again removed from the battery. As shown above, 5 Ah removed from the battery should result in a 5% decrease in the state of charge. Thus, $$SOC' \text{ is } 68.7\% - 5\% = 63.7\%.$$

$SOC_c$ is determined by multiplying $$SOC'$$

by $\beta$. In this cycle, $\beta$ is 0.96 and thus, $SOC_c=61.0$. $V_{oc}$ is then measured to determine $SOC_m$ and the error is obtained from the difference between $SOC_c$ and $SOC_m$. In Cycle 3 of the present example, $V_{oc}$ is measured at 12.02V and $SOC_m$ is determined to be 60.8%. Thus, the error is determined to be 0.2. The error registers, E1, E2 and E3 are updated by shifting the error values so that the current error is entered into E1. The new $\beta$, value is then calculated based on the error values and the previous value of $\beta$.

As shown in FIG. 2, the determination of SOH continues for a total of 6 cycles of the battery 12 with the SOH reaching 92.73 after Cycle 6. It will be appreciated that the values shown in FIG. 2 and referred to above are for exemplary purposes only. It will also be appreciated that after the SOH is accurately determined, a decline in the SOH is likely to be observed only over a large number of cycles.

As discussed, the determination of SOH is carried out over a number of cycles of operation of the battery. The battery is not removed from use for off-line testing. Instead, the SOH is determined using measurements and calculations relating to the particular application and pattern of use of the battery.

When the SOH declines to a certain level, the system 10 gives off a warning to alert the user to the low state of health and to advise that the battery should be replaced. The warning can be for example an alert on the LCD display 18. For example, a warning can be displayed on the LCD display when the SOH reaches 70%. Other warnings can be given, however. Further, such warnings can be transmitted for remote monitoring. Such transmission can be carried out in any suitable manner for monitoring, for example, at a remote computing device. The hardware and software for transmission and remote monitoring is well within the grasp of one skilled in the art.

It will be appreciated that, although embodiments of the invention have been described and illustrated in detail, various modifications and changes may be made. For example, rather than being limited to a lead acid battery, it is conceivable that the present invention can be extended to other battery chemistries such as a lithium ion battery. Still further alternatives and modifications may occur to those skilled in the art. All such alternatives and modifications are believed to be within the scope of the invention as defined by the claims appended hereto.

What is claimed is:

1. A method of monitoring a battery comprising:
  measuring an open circuit voltage ($V_{oc}$) on the battery to determine a measured state of charge ($SOC_m$) after at least one use;
  obtaining a calculated state of charge ($SOC_c$) based on a state of charge prior to said at least one use and a discharge of the battery during said at least one use; and
  determining a state of said battery based at least in part on a difference between said calculated state of charge and said measured state of charge, and a weighted average of said previously determined differences between said calculated state of charge and said measured state of charge for said battery.

2. The method according to claim 1, wherein said state of said battery is determined based on a previous state of said battery and said difference between said calculated state of charge and said measured state of charge.

3. The method according to claim 2, wherein said state of said battery is a percentage of capacity said battery is determined to provide with respect to a rated value of said battery.

4. The method according to claim 1, wherein said discharge of the battery during said at least one use is calculated using coulomb counting and taking into account an expected capacity.

5. The method according to claim 4, wherein said expected capacity is calculated based on a rated capacity and a rated current value for said battery as well as an actual current during said at least one discharge.

6. The method according to claim 1, wherein said discharge of the battery is calculated by determining $$\frac{IdT}{C'},$$

where C' is determined as follows:

$$C' = C_o \left(\frac{I}{I_o}\right)^{-\gamma},$$

where $C_o$ is a rated capacity (amp·hours), I is an actual current discharged (amps), $I_o$ is a rated current (amps) and $\gamma$ is based on supplier battery discharge curves.

7. The method according to claim 1 wherein said calculated state of charge is calculated according to the formula:

$$SOCc_n = \beta\left[SOCc_{n-1} + \frac{IdT}{C'}\right],$$

where C' is an expected capacity of the battery, IdT is an integrated coulomb counting, and β is a value related to a difference between $SOCc_{n-1}$ and $SOCm_{n-1}$.

8. The method according to claim 7, wherein the expected capacity of the battery is determined according to the formula:

$$C' = C_o\left(\frac{I}{I_o}\right)^{-\gamma},$$

where $C_o$ is the rated capacity (amp·hours), I is the actual current discharged (amps), $I_o$ is the rated current (amps) and γ is based on supplier battery discharge curves.

9. The method according to claim 7, wherein a change in β is determined based on a weighted average of previously determined differences between SOCc and SOCm.

10. The method according to claim 9, wherein a new value of β is calculated based on a previous value of β and the change in β.

11. The method according to claim 10, wherein the state of said battery is related to the value of β.

12. A system for monitoring a battery comprising:
a meter for measuring an open circuit voltage on the battery to determine a measured state of charge after at least one use;
a calculation device for determining a calculated state of charge based on a state of charge prior to said at least one use and a calculated discharge of the battery during said at least one use, and for determining a state said battery based at least in part on said difference between said calculated state of charge and said measured state of charge, and a weighted average of said previously determined differences between said calculated state of charge and said measured state of charge for said battery.

13. The system according to claim 12, wherein said calculation device determines said state of said battery based on a previous state of said battery and said difference between said calculated state of charge and said measured state of charge.

14. The system according to claim 12, wherein said calculation device determines said state of said battery as a percentage of capacity said battery is determined to provide with respect to a rated value of said battery.

15. The system according to claim 12, wherein said calculation device determines the calculated discharge of the battery based on coulomb counting and taking into account an expected capacity.

16. The system according to claim 12, wherein said calculation device determines said expected capacity based on a rated capacity, and a rated current value for said battery as well as an actual current during said at least one discharge.

17. The system according to claim 12, wherein said calculation device determines said discharge of the battery by determining $$\frac{IdT}{C'},$$

where $$C' = C_o\left(\frac{I}{I_o}\right)^{-\gamma},$$

where $C_o$ is a rated capacity (amp·hours), I is an actual current discharged (amps), $I_o$ is a rated current (amps) and γ is based on supplier battery discharge curves.

18. The system according to claim 12, wherein said calculation device determines said calculated state of charge according to the formula:

$$SOCc_n = \beta\left[SOCc_{n-1} + \frac{Idt}{C'}\right],$$

where C' is an expected capacity of the battery, IdT is an integrated coulomb counting, and β is a value related to a difference between $SOCc_{n-1}$ and $SOCm_{n-1}$.

19. The system according to claim 18, wherein said calculation device determines the expected capacity of the battery according to the formula $$C' = C_o\left(\frac{I}{I_o}\right)^{-\gamma},$$

where $C_o$ is the rated capacity (amp·hours), I is the actual current discharged (amps), $I_o$ is the rated current (amps) and γ is based on supplier battery discharge curves.

20. The system according to claim 18, wherein said calculation device determines a change in β based on a weighted average of previously determined differences between SOCc and SOCm.

21. The system according to claim 20, wherein said calculation device calculates a new value of β based on a previous value of β and the change in β.

22. The system according to claim 21, wherein said state of said battery is directly related to the value of β.

23. A method of monitoring a battery comprising:
measuring an electrical characteristic after at least one use to provide a measured electrical characteristic;
obtaining a calculated electrical characteristic based on the electrical characteristic prior to said at least one use and a discharge of the battery during said at least one use; and
determining a state of said battery based at least in part on a difference between said measured electrical characteristic and said calculated electrical characteristic, and a weighted average of said difference and previously determined differences between said calculated electrical characteristic and said measured electrical characteristic.

* * * * *